US005150039A

United States Patent [19]

Avocat

[11] Patent Number: 5,150,039

[45] Date of Patent: Sep. 22, 1992

[54] ELECTRICAL MEASURING TRANSFORMER

[76] Inventor: Jean-Paul P. Avocat, 4, rue Philippe Lebon, 59500 Lambres Lez Douai, France

[21] Appl. No.: 607,650

[22] Filed: Oct. 30, 1990

Related U.S. Application Data

[63] Continuation of Ser. No. 365,252, Jun. 12, 1989, abandoned.

[30] Foreign Application Priority Data

Jun. 17, 1988 [FR] France ............................ 88 08555

[51] Int. Cl.[5] ..................... G01R 1/20; G01R 15/08

[52] U.S. Cl. ............................... 324/127; 324/115

[58] Field of Search ..................... 324/127, 115, 107; 439/43-54; 361/352

[56] References Cited

U.S. PATENT DOCUMENTS

| | | | |
|---|---|---|---|
| 249,574 | 11/1881 | Blake | 361/352 |
| 1,641,757 | 9/1927 | Hall | 324/107 |
| 1,800,474 | 4/1931 | Scherer | 324/115 |
| 2,384,350 | 9/1945 | Skulley | 324/115 |
| 2,594.069 | 4/1952 | Poehlmann | 439/54 |
| 2,608,626 | 8/1952 | Morgan | 439/43 |
| 2,891,438 | 6/1959 | Fuhrmann et al. | 324/115 |
| 3,002,169 | 9/1961 | Kamm | 439/44 |
| 3,049,645 | 8/1962 | Skirpan | 439/43 |
| 3,514,694 | 5/1970 | Beachley | 324/107 |
| 3,957,333 | 5/1976 | Kaminski | 439/53 |

*Primary Examiner*—Ernest F. Karlsen
*Attorney, Agent, or Firm*—Sandler, Greenblum & Bernstein

[57] ABSTRACT

A single-phase multi-ratio current transformer, having at least two different current ratio or output levels through the appropriate wiring of its output leads without any intervention of the main current circuit of the system, having a primary current conductor, a secondary circuit having at least two change-over output wires $S_2$ and $S_3$, respectively connected to two contacts and a main output terminal connected to a common contact. A plurality of corresponding plug-in configurational devices, each have at least one jumper wire positioned to the common contact to only one of the two contacts, in order to give the current transformer the current ratio or output level corresponding to the selected wire $S_2$ or $S_3$, each configurational device serving as a key corresponding to a single current ratio or output level, so that when one of the keys is secured to the main part of the transformer, in accordance with the selected ratio or level of the current rating of the line, only one position of the key fits on to the main part of the transformer. There can also be provided n current transformers housed in the same enclosure wherein each configurational device is common to the n phases having n jumpers fixed in a position to correspond to the same current ratio or output level for the n phases.

15 Claims, 2 Drawing Sheets

ELECTRICAL MEASURING TRANSFORMER

This application is a continuation, of application Ser. No. 07/365,252 filed Jun. 12, 1989, now abandoned.

BACKGROUND OF THE INVENTION

The invention relates to an electrical measuring transformer or a control assembly for a multi-ratio transformer in a power-metering system or in a protective relay arrangement. More particularly, the present invention concerns single- or multiphase transformers, capable of converting an actual electrical magnitude into a compatible digital value by means of a measuring, counting, control or monitoring module.

The invention will find applications in the field of electrical construction of such transformers and, more especially, in the manufacture of current transformers.

In this context, it is known that such current transformers are constituted by a primary circuit and a secondary circuit which give to the secondary circuit a proportionally reduced current which is galvanically insulated from the current flowing through the primary circuit.

Such transformers are utilized to feed measuring, counting, control or monitoring modules. These modules are in general designed to operate with a weak current and therefore require the utilization of measuring transformers when the magnitude of the currents to be controlled is greater than the rated value of said modules which, as a rule, is of the order of five Amperes.

Given the specific applications of certain control and counting modules, the transformers are so constructed that the stepped-down current of the secondary circuit is exactly proportional to the primary current, that is to say, to be the total image thereof. This is particularly important when the counting module serves for the invoicing of the power consumed by a user connected to the national distribution grid.

In such a case, there appear different sources of erroneous invoicing which may be prejudicial either to the consumer or to the distributor.

In fact, in spite of the precision applied to the counting modules and the strict controls to which these are subjected, if the image of the consumed current is not reliable, the counting will be falsified. This may derive from the construction of the measuring transformer as such, but, to an equal extent, from the inadequate adaptation of the transformer to the counting module.

In particular, certain apparatuses function badly or less well below a certain threshold of the secondary current, which is the reason while the latter must then be comprised between a lower limit and an upper limit, in other words, within an operating range characterised by its rated value.

Similarly, depending on the type of module to be fed and, to be more specific, depending on the power consumed by the module thus fed, it is necessary to construct the measuring transformer differently in order to effect a correction of Amperes/revolutions such that the error curve of the transformation ratio, specific to the transformer, be comprised between two values defined by the standards or by the distributor or by the regulating body concerned.

In practice, when the transformer is constructed for use in association with an electro-mechanical module, it is accepted that the power absorbed be of the order of 15 VA. In this case, the error curve of the transformation ratio is comprised within fixed limits. By contrast, if this same transformer were to be used with an electronic counter or other module, the absorbed power will be much lower, of the order of 3 VA, and the error curve would fall outside the permitted limits, which would falsify the measurement.

Other causes of erroneous measurement may also be attributable to the person installing the module, by a faulty wiring or an improper choice in the calibration of the measuring transformer.

In fact, in the case of the control of multiphase, more especially three-phase networks, the measurement of intensity must be carried out on each phase form example by means of a multiphase set. To facilitate terminology, we shall be referring to a "multiphase transformer" in what follows. However, in the case of current measurement, this multiphase transformer shall be composed of "n" single-phase transformers.

In the case of the triphase method, there are employed as a rule three single-phase transformers which are adequately coupled so as to obtain a good measurement. In particular, care must be taken to respect the direction of winding, in order to avoid accidental dephasing, and to ensure an identical selection of the calibration of the three transformers.

With regard to this latter point, in the case of electrical power distribution consumption by the users will differ from one user to another, and it is possible to visualise user networks consuming 50 Amperes while others consume 2000 Amperes. The function of the intensity transformer is to adapt the power consumed to the rated value of the counter, which makes it possible to provide a single type of counter.

However, it is not possible to provide a single type of measuring transformer because, as mentioned above, when working with a transformer rated for 1000 Amperes, it will yield erroneous readings if the consumption is only 50 Amperes, due to the fact that its operating range is characterized by its rated value.

A study of the adequacy of these respective operating ranges has shown that there is employed in general practice a range of six current transformers, covering practically all requirements, with transformation ratios of 10, 20, 40, 100, 200 and 400 for 5 Amperes on the secondary winding.

This being the case, it is necessary to hold in stock or to utilize one of these six ratios. Moreover, it is frequently found that,in a three-phase set, one of the transformers used is not identical to the two others.

To the above enumerated disadvantages must be added an operational drawback, taking into account the temporal evolution of the consumption on the network.

In fact, it is a frequent occurrence in power-metering practice that with time the user increases his consumption and demands the modification of the rating of his counter. In this case, it is necessary to intervene at the level of the distribution board and to replace all the measuring transformers.

At present, no device exists which would remedy these different disadvantages, and the good functioning of the installations essentially depends on human control.

SUMMARY OF THE INVENTION

The object of the present invention is to provide an electrical measuring transformer, of the single- or multiphase type, capable of converting an actual electrical magnitude in a digital value compatible with a measuring, counting, controlling or monitoring module which would remedy the aforecited disadvantages by eliminating all risks of human error.

One object of the present invention is to provide an electrical measuring transformer, the configuration of which is adapted as a function of the selected operational range, that is to say, a transformer which, once its characteristics are determined relative to its application, should be easily adaptable to this application by preventing the risks of faulty wiring.

Another object of the present invention is to provide an electrical measuring transformer having at least two ratings, that is to say, two operating ranges, thus making for temporal evolution without having to change the installation to convert it if such evolution does take place.

More particularly, the measuring transformer according to the present invention has two consecutive transforming ratios, namely 10, 20 or 20, 40, etc., which, during its first utilization, is configured to the first ratio and the structure of which is conceived to adapt the transformer as a function of the selected operational range, by effecting, in particular, the commutation of the windings according to the selected range.

Another object of the present invention is to provide a measuring transformer, the control of transformer configuration of which as a function of the selected operational range is possible in order to avoid any anomaly.

In fact, the risks of erroneous measure are increased with the utilization of double-rated transformers because, if the configuration of the transformer is erroneous, the counter would read, as the case may be, one-half of the consumption or a double consumption if the ratio between the two ratings is 2.

To counter such a drawback, the present invention provide an electrical measuring transformer having means for controlling transformer configuration, which means may be, in a simplified version, exclusively visual and which, in a more elaborate version, may react automatically by signalling a mismatch.

Another object of the present invention is to provide a measuring transformer is to be easily adaptable as a function of the power required by measuring, counting, controlling or monitoring module and which, in particular, should allow a consumption of 3 VA or 15 VA, depending on whether an electronic or an electromechanical module is being operated.

Another object of the present invention is to provide a multiphase electrical measuring transformer which, during its installation, adapts, single operation, the transformer configuration as a function of the selected operational range without wiring mistakes, to adapt the transformer configuration as a function of the measuring utilization and/or to control the transformer configuration as a function of the selected operational range and/or of the measuring utilization.

Other objects and advantages of the present invention will be apparent from the following description, which is given here solely by way of a non-limiting example.

According to the present invention, the single-phase or multiphase electrical measuring transformer, capable of converting an actual electrical magnitude in a value compatible with a measuring, counting, control or monitoring module, such as in particular a current transformer designed for metering purposes, said transformer having at least one winding, a primary circuit, a secondary circuit defining a transformation ratio and thus an operational range, is characterized in that it comprises means for adapting the transformer configuration in dependence of the selected operational range, which means effect at least the commutation of the winding or windings according to the selected range.

Another feature of the present invention consists in that the transformer comprises means for controlling transformer configuration in dependence of the selected range, said means being capable of delivering output data depending on the effected configuration.

Another feature of the present invention consists in that the transformer comprises in addition means for adapting the configuration of the transformer as a function of the measuring application, namely to the power required by the measing, counting, control or monitoring module, in order to correct the imaged value of the actual measurement supplied.

BRIEF DESCRIPTION OF THE DRAWINGS

The present invention will be better understood from the following description, made with reference to the accompanying drawings which are an integral part thereof.

DETAILED DESCRIPTION OF THE PREFERRED EMBODIMENTS

The invention relates to a single-phase or multiphase electrical measuring transformer. Such a transformer will be provided in particular for converting an actual electrical magnitude in a value compatible with a measuring, counting, control or monitoring module.

A typical application of the present invention will be the construction of current transformers designed for single-phase or multiphase power metering. Nevertheless, other applications could be considered, for example to give data proportional to measured values to measuring apparatus, protection relays or any other monitoring system. Although the present invention was made in the field of electrical power measuring transformers, it could be tansposed to other fields and, for example, to voltage-measuring transformers.

This being the case, it is noted that in electrical power metering practice there is employed a counter capable of recording a power delivered during a certain time interval, the power being measured on the base of effective voltages and consumed currents.

In general, the measurement of voltages offer very few problems, because the measuring device can be easily constructed for voltages up to 1000 Volts. By contrast, with regard to current, the latter may rise up to 2000 Amperes, for example, so that electrical current measuring transformers are called for. However, the quality and the precision of measurement will depend on the correct selection of rating of said transformers and the accurate winding thereof.

Figure 1:
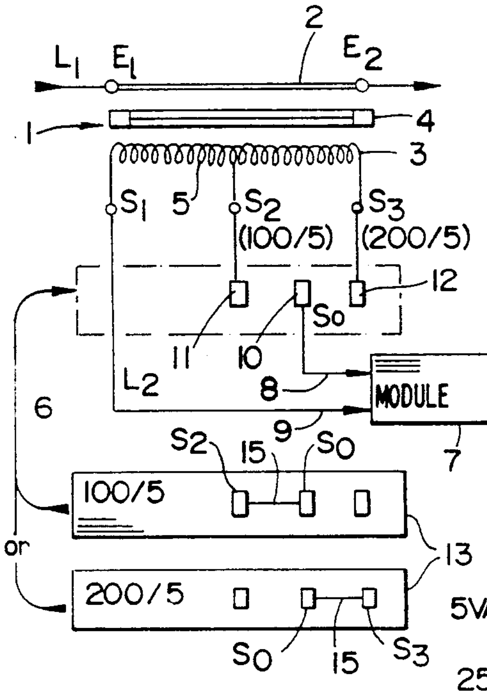
FIG. 1 illustrates diagrammatically a first form of embodiment of the single-phase electrical measuring transformer according to the present invention.

FIG. 1 illustrates a single-phase current transformer (1), according to the present invention, in a simplified version to better understand the essentials of the invention.

The transformer (1) comprises, conventionally, a primary circuit (2) as well as a secondary circuit (3), distributed over a magnetic circuit (4).

In the case of the single-phase current transformer, the magnetic circuit has a generally toroidal shape defining a central space capable of receiving the phase winding which in this case defines the primary winding (2) and on which torus is wound at least one secondary coil for (or secondary winding) (5).

Thus, the current transformer (1) is defined by its nominal value of secondary current, its transforming ratio and the limits imposed on its errors within a range of variation of the primary current, that is to say, its operational range.

This being the case, according to the invention, the secondary winding is provided in such a manner as to allow two ratings, in other words, two normal application ranges.

Thus, the secondary circuit (3) has at least one winding (5), with intermediate contact or with two separate windings.

As shown in FIG. 1, the primary circuit has two connection terminals (El) and (E2), while the secondary circuit has three connection terminals (S1), (S2) and (S3).

The three connection terminals (secondary winding top terminals) include the wires ending in contacts 11 and 12, with either contact engaging a conductor to connect the connection terminal with output terminal 8, via contact 10.

The winding is carried out in such a manner, that the ratio the of primary current (i1) to the secondary current (i2) defines two transformation (or current) ratios. In the example illustrated, at the terminal (S2) the ratio is 100/5, while on the terminal (S3) the ratio is 200/5.

Depending on the application, the operator should connect its user module (7) between the terminals (S1) and (S2) if the primary current is of the order of 100 Amperes maximum, or to the terminals (S1) and (S3) if the primary current (i1) is of the order of 200 Amps. According to the first characterizing feature of the present invention, the transformer (1) comprises means (6) in the form of a transformer configuration device (13); and to adapt the configuration of transformer (1) to the selected operational range, which effects at least the commutation of the secondary winding or windings (5) according to the selected range.

In the case of the single-phase transformer shown in FIG. 1, the definition of the two selectable operational ranges is effected solely by the means (6), which adapt the configuration of the transformer (1) to the ratio of transformation by realizing the internal wiring of the secondary winding or windings (5).

In fact, in the case of selection of a first transformation ratio, in particular 100/5, these means establish a connection between (S2) and (S0), whilst in the case where a higher ratio is selected, in particular 200/5, the connection then established is (S3)-(S0). Thus, the module (7) is always connected between the terminals (S1) and (S0), whatever the rating selected.

The importance of these means becomes greater when considering a multiphase transformer, such as a three-phase transformer. In this case, each secondary circuit (3) has at least on each controlled phase at least one winding (5) with intermediate contact or two separate windings.

In order to define the two selectable operational ranges, the means (6) for adapting the transformer configuration then constitute simultaneously the wiring of said winding or windings (5) of each secondary phase considered.

Figure 5:
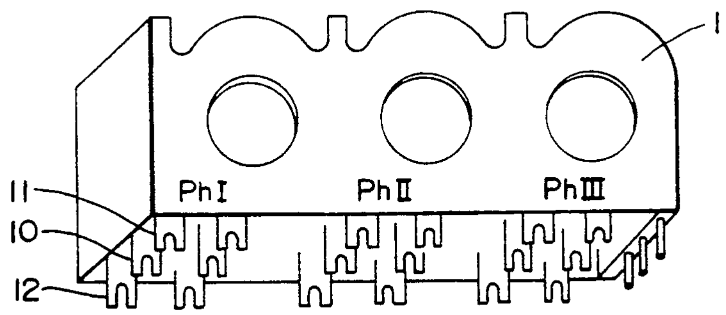
FIG. 5 shows a perspective view of a three-phase current transformer the winding of which is conformed according to the present invention.
Figure 6:
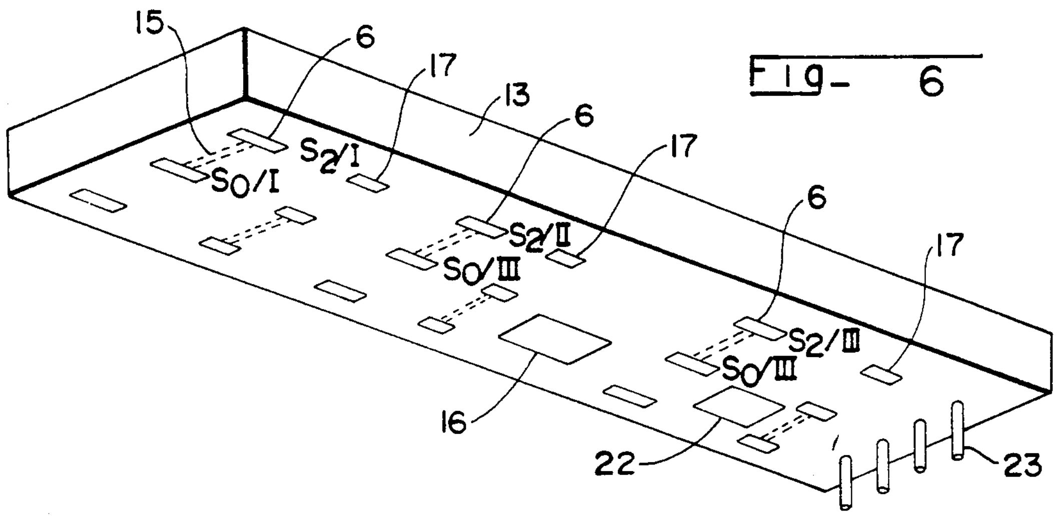
FIG. 6 shows, in a perspective view as seen from below, the means according to the present invention for adapting and/or controlling the transformer configuration in dependence of the selected oprational range according to one form of embodiment.
Figure 7:
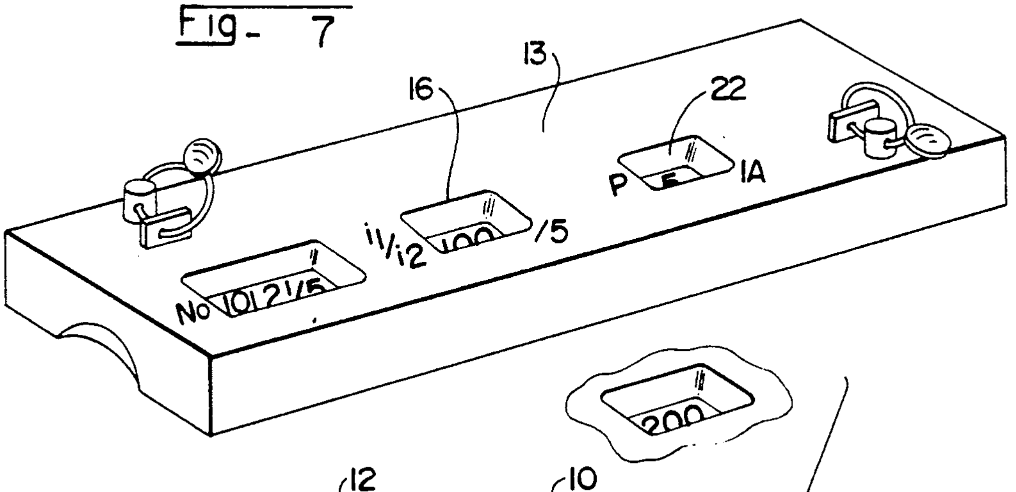
FIG. 7 illustrates a perspective view, as seen from above, of the means illustrated in FIG. 6.

An example of embodiment of such a three-phase transformer is illustrated in FIGS. 5, 6, 7 and more particularly FIG. 6 shows the different connections which are established, for example in the case of the 100/5 ratio,between (S0) and (S2) of phase I, (S0) and (S2}of phase II, (S0) and (S2) of phase III.

These connections are realized simultaneously in a single operation, which makes it possible to avoid all risks of faulty wiring, errors in winding direction and mistakes in the selection of the rating of one secondary relative to another.

Figure 3:
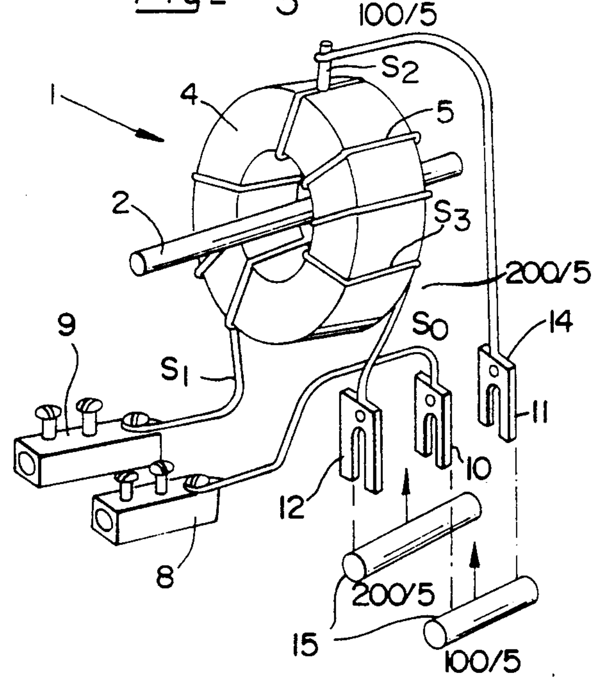
FIG. 3 a simplified perspective view of the embodiment of the secondary winding of a single-phase current transformer functioning according to the principle of FIG. 1.
Figure 4:
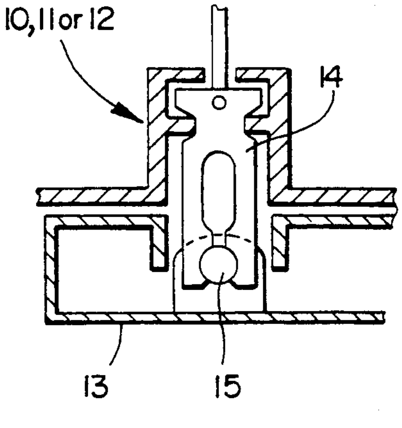
FIG. 4 shows a detail of embodiment of the transformer as illustrated, for example, in FIG. 3, with means for adapting the transformer configuration.
Figure 8:
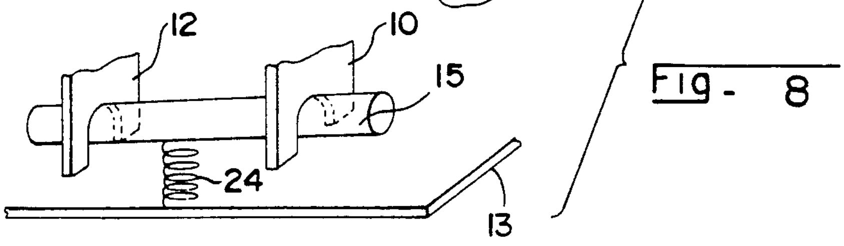
FIG. 8 shows a variant of embodiment of the means illustrated in FIG. 4.

With regard to the structure of these means, FIGS. 3, 4 and 8 illustrate a first variant of embodiment of a single-phase transformer.

In particular, FIG. 3 shows a toroidal magnetic core (4) on which is coiled a secondary winding (5) with tapping, in the interior of which torus will be disposed the primary circuit (2), generally constituted by the conductor wire itself in which the current is to be measured.

The different outputs of the secondary winding (5), referenced (S1), (S2), (S3) as well as the module output referenced (S0) are connected to electrical contacts referenced (8) and (9) for the outputs (S0) and (S1) leading to the module and, respectively, (10, 11, 12) for the outputs (S0, S2 and S3) to be commuted. Thus, the electrical contacts (8 and 9) form output terminals.

For a given transformer configuration, that is to say, particularly in order to define a rating, the means (6) have the form of a wiring-support plate or key member (13), which can be attached, pin-connected or form-locked on the body of transformer (1) depending on the forms of embodiment, the wiring of which is constituted as a function of its selected operational range.

For example, in a form of embodiment such as illustrated in FIG. 4, the contacts (10, 11, 12) are constituted by flexible forks, obtained in particular by cutting from a strip of phosphorous bronze, referenced (14), capable of cooperating with a cylinder or rod (15) functioning as a jumper conductor made of a copper-containing alloy. Such embodiments are known to those skilled in the art.

By way of a variant, FIG. 8 shows another embodiment in which, instead of using a flexible fork holding fast a contact rod, two U-shaped contacts are utilized against which the contact rod is pushed by a spring (24).

This being the case, in order to avoid any mistake, the transformer according to the present invention advantageously comprises additional means (16) for controlling transformer configuration as a function of the selected operational range, said means being capable of delivering data which is dependent on the achieved configuration.

In a simplified version, these means (16) are constituted by a window cut out of each plate (13) constituting the means (6), said windows displaying an inscription made on the body of the transformer and indicating the selected ratio.

In a more elaborate form of embodiment, these means for controlling the configuration will deliver a registrable output data, particularly by electrical means. This will be described in more detail, particularly with respect to FIG. 2.

Figure 2:
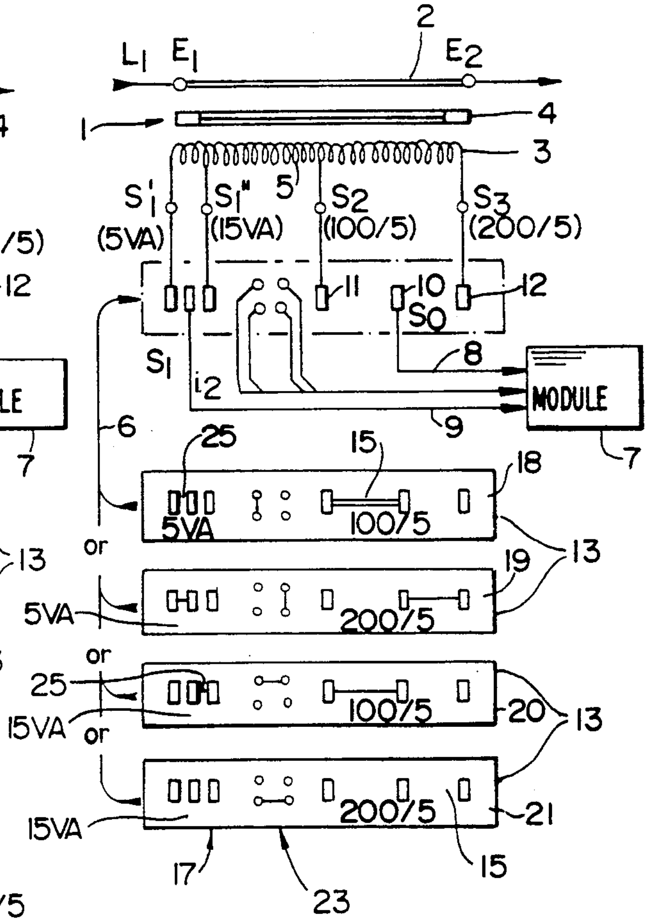
FIG. 2 shows diagrammatically a more elaborate variant of a single-phase measuring transformer according to the present invention.

In this respect, FIG. 2 shows a form of embodiment of a single-phase transformer according to the present invention, which bears the specific features described above and shows in particular the said means (6) for adapting the configuration of the transformer to the selected operational range.

However, in this variant, the transformer (1) comprises additional means (17) for adapting the configuration of the transformer (1) to measuring operation, more particularly as a function of the power requirement of the measuring, counting, control or monitoring module, in order to correct the "imaged" value of the actual measurement effected.

These means (17) are carried by the said means (6), effecting the commutation of the winding or windings in accordance with the selected operational range. Thus, in a single operation, the wiring of the windings will be effected according to the requirements in each case.

This adaptation of the transformer which, as already stated above, effects a correction of Amperes turns in order to confine the error curve of the transformation ratio within a permissible range, will be effected by commuting, according to the requirements of each case, at the level of one extremity of the secondary winding (5) the output (S1) (9) of the user module to the secondary circuit connecting terminal output (S'1) or (S"1) of the winding (5).

In an advantageous form of embodiment, there will be effected a tapping at the beginning of the winding which, in the position (S"1), will make it possible to displace slightly the error curve for an electromechanical module with a power consumption of approximately, 15 VA.

FIG. 2 illustrates a singlephase version of the transformer, the secondary circuit (3) having at least one winding (5) with intermediate tapping or again with two separate windings to define the transformer characteristic as a function of the measured necessary input power. Thus, there are two means for providing a range of transformation ratios; either by intermediate tapping of a single winding, or, by providing a separate winding for each desired transformation ration. The means (17) provide the internal wiring at the level of the input of the winding, and this in accordance with the principle previously described with reference to means (13).

Thus, in FIG. 2, the four possible variants of wire support plates or members (13) have been shown and, in particular, reference (18) designates the plate enabling the configuration of the transformer (1) for a 100/5 rating for a measuring power 5 VA, at reference (19) the configuration 200/5 for 5 VA, at (20) the configuration 100/5 for 15 VA and at (21) the configuration 200/5 for 15 VA.

By extension, the present invention also applies to a multiphase transformer, in particular a three-phase phase transformer. In this case, the secondary circuit has at least on each secondary phase at least one winding (5) with intermediate tapping or again two separate windings to define the transformer characteristic as a function of the necessary input power, and the means (17) for adapting the transformer configuration to its utilization simultaneously constitute the internal wiring of said winding or windings of each secondary phase.

In this case, as previously described, the means (6) for adapting the transformer to the selected operational range and the means (17) for adapting the transformer configuration to the measuring utilization are carried by the same wire support plate (13) which simultaneously provides the connections.

In other words, each of the four plates or members (13), which ensure the adaptation of the transformer configuration, appear in the form of an insulating plate of which are disposed a first series of electrical bridge or jumper wire circuits (15) in dependence of the connections to be established for determining the rating, and a second series of bridge circuits (25) in dependence of the connections to be established for determining the power. Moreover, the said transformer body carries flexible or other contacts joined to the secondary windings and capable of cooperating with the bridge circuits ofthe first and second series.

FIGS. 5 and 6 illustrate such a three-phase transformer for current measurement, making it possible to adapt the transformer configuration to the operational range and to the module input power.

This being the case, in order to control the configuration of the transformer as a function of the module input power, the transformer comprises means (16, 22) making this control possible, which means, as previously have the form of windows displaying the inscriptions engraved on the body of the assembly.

However, in order to achieve a more objective control, the transformer will comprise means (23) capable of delivering an output reading depending on the achieved configuration.

In particular, these means (23) take the form of an auxiliary circuit associated physically and structurally to the said means (6) and/or (17) for adapting the configuration of the transformer.

Such an auxiliary circuit will yield, for example, a different electrical output data depending on the prevailing configuration, which data could be processed for example by the user module and could, in particular detect an anomaly.

In particular, in the case of power metering, if the metering is designed for an intensity of 200 Amperes, and if, by mischance, the transformer has been configured for 100 Amperes, the two data sets do not coincide and an alarm could be triggered.

For the structural embodiment of this auxiliary circuit, various indicator means known to those skilled in the art can be utilized. For example, as illustrated in FIG. 2, four contacts can be provided whose relative connections allow at least four positions. Nevertheless, other branch connections could be used, and it would also be possible to utilize ohmic resistors having different ratings, according to each case.

Lastly, the transformer could be additionally fitted with any other safety device, such as sheething, sealing or other.

Other applications of the present invention, known to those skilled in the art, could be envisaged without operating from the scope of the invention.

We claim:

1. An electrical measuring apparatus for measuring one or more electrical values present in a primary circuit, said apparatus comprising:

a secondary circuit comprising at least one winding, said secondary circuit comprising a plurality of secondary circuit connection terminals for defining a plurality of respective unique transformation ratios, a first output terminal connected to said secondary circuit, a second output terminal, and a common contact connected to said second output terminal;

plural selection means for enabling a selection of one said plurality of unique transformation ratios, each of said selection means comprising a transformer configuration device which is dimensioned and configured to be plugged into said secondary circuit to selectively allow a connection between said common contact and a respective one of said plurality of secondary circuit connection terminals corresponding to a selected one of said plurality of unique transformation ratios; and means coupled to said secondary circuit for measuring an electrical value corresponding to the current present in at least one of said plurality of secondary circuit connection terminals.

2. The electrical measuring apparatus of claim 1, further comprising a plurality of said transformer configuration devices, each of which is selectively connectable to said common contact and a respective one of said plurality of secondary circuit connection terminals corresponding to a selected one of said plurality of unique transformation ratios.

3. The electrical measuring apparatus of claim 1, further comprising:

a main transformer body which supports said secondary circuit, said plurality of secondary circuit connection terminals, and said common contact; said transformer configuration device being adapted to mate with said main transformer body in a predetermined unique manner, said transformer configuration device having at least one jumper conductor fixed in a position such that said jumper conductor connects said common contact and said respective one of said plurality of secondary circuit connection terminals when said transformer configuration device is mated with said main transformer body in said predetermined unique manner.

4. The electrical measuring apparatus of claim 1, wherein said plurality of secondary circuit terminals are tapped into said secondary circuit winding at predetermined points in the winding for defining said plurality of respective unique transformation ratios.

5. The electrical measuring apparatus of claim 1, wherein said secondary circuit comprises a plurality of windings, wherein each of said plurality of secondary circuit terminals is connected to a respective one of said plurality of winding of said secondary circuit for defining said plurality of respective unique transformation ratios.

6. The electrical measuring apparatus of claim 1, comprising a single phase transformer.

7. The electrical measuring apparatus of claim 1, comprising a multi-phase transformer having a plurality of portions housed in a main transformer body, each of said plurality of portions having a respective secondary circuit, a respective common contact, and respective pluralities of secondary circuit connection terminals for defining a respective plurality of respective unique transformation ratios.

8. The electrical measuring apparatus of claim 7, said transformer configuration device adapted to mate with said main transformer body in a predetermined unique manner, said transformer configuration device having at least one jumper conductor for each of said plurality of portion of said multi-phase transformer fixed in a position such that each of said jumper conductors connects a respective one of said common contacts and respective ones of said plurality of secondary circuit connection terminals when said transformer configuration device is mated with said main transformer body in said predetermined unique manner.

9. The electrical measuring apparatus of claim 1, further comprising means for adjusting said apparatus for one of a plurality of optional operation parameters.

10. The electrical measuring apparatus of claim 9, wherein said means for adjusting said apparatus for one of a plurality of optional operation parameters comprises a second plurality of secondary circuit connection terminals for selective connection to said first output terminal.

11. The electrical measuring apparatus of claim 10, further comprising:

a main transformer body which supports said secondary circuit, said plurality of secondary circuit connection terminals, said common contact, and said second plurality of secondary circuit connections;

said transformer configuration device adapted to mate with said main transformer body in a predetermined unique manner, said transformer configuration device having at least a first jumper conductor fixed in a position such that said first jumper conductor connects said common contact and said respective one of said plurality of secondary circuit connection terminals, and at least a second jumper conductor fixed in position such that said second jumper conductor connects said first output terminal and a respective one of said second plurality of secondary connection terminals corresponding to said one of said plurality of optional operation parameters, when said transformer configuration device is mated with said main transformer body in said predetermined unique manner.

12. The electrical measuring apparatus of claim 1, comprising a multi-phase transformer having a plurality of portions housed in a main transformer body, each of said plurality of portions having:

a respective secondary circuit, a respective common contact, and respective pluralities of secondary circuit connection terminals for defining a respective plurality of respective unique transformation ratios; and a respective second plurality of secondary circuit connection terminals for selective connection to said first output terminal.

13. The electrical measuring apparatus of claim 9, wherein said one of a plurality of optional operation parameters comprises the power rating of said apparatus.

14. The electrical measuring apparatus of claim 1, said transformer configuration device comprising an inscription for indicating a transformation ratio.

15. The electrical measuring apparatus of claim 1, comprising an auxiliary circuit for transmitting information indicative of said transformation ratio to an indicator.

* * * * *